(12) United States Patent
Nishioka (10) Patent No.: US 11,380,414 B2
(45) Date of Patent: Jul. 5, 2022

(54) TSV AUTO REPAIR SCHEME ON STACKED DIE

(71) Applicant: MICRON TECHNOLOGY, INC., Boise, ID (US)

(72) Inventor: Naohisa Nishioka, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/173,064

(22) Filed: Feb. 10, 2021

(65) Prior Publication Data
US 2021/0193242 A1 Jun. 24, 2021

Related U.S. Application Data

(63) Continuation of application No. 16/590,789, filed on Oct. 2, 2019, now Pat. No. 10,930,363.

(51) Int. Cl.
*G11C 29/12* (2006.01)
*H01L 23/00* (2006.01)
(Continued)

(52) U.S. Cl.
CPC ...... *G11C 29/12015* (2013.01); *G11C 7/1096* (2013.01); *G11C 7/222* (2013.01); *G11C 8/12* (2013.01); *G11C 8/18* (2013.01); *G11C 29/4401* (2013.01); *H01L 23/481* (2013.01); *H01L 24/05* (2013.01); *H01L 24/06* (2013.01);
(Continued)

(58) Field of Classification Search
CPC . G11C 29/12015; G11C 7/1096; G11C 7/222; G11C 8/12; G11C 8/18; G11C 29/4401; H01L 23/481; H01L 24/05; H01L 24/06; H01L 24/16; H01L 24/17; H01L 25/0657; H01L 25/18; H01L 2224/0557; H01L 2224/06181; H01L 2224/16145; H01L 2224/17181; H01L 2225/06513;
(Continued)

(56) References Cited

U.S. PATENT DOCUMENTS 9,401,312 B1 7/2016 Kannan et al.
10,916,489 B1 2/2021 Nishioka et al.
(Continued)

OTHER PUBLICATIONS

ISR/WO dated Dec. 24, 2020 for PCT Application No. PCT/US2020/052007, 13 pgs.
(Continued)

*Primary Examiner* — Kyle Vallecillo
(74) *Attorney, Agent, or Firm* — Dorsey & Whitney LLP (57) ABSTRACT

Disclosed herein is an apparatus that includes a first semiconductor chip having a plurality of pad electrodes and a plurality of first latch circuits assigned to an associated one of the pad electrodes, a second semiconductor chip having a plurality of TSVs each electrically connected to an associated one of the pad electrodes and a plurality of second latch circuits assigned to an associated one of the TSVs, and a training circuit configured to perform a training operation on a signal path including the selected one of the pad electrodes and the selected one of the TSVs. The training circuit is configured to activate a fail signal when the signal path is determined to be defective. The fail signal is stored in the selected one of the first latch circuits and the selected one of the second latch circuits.

20 Claims, 11 Drawing Sheets

(51) Int. Cl.
  *H01L 25/18* (2006.01)
  *H01L 23/48* (2006.01)
  *G11C 7/22* (2006.01)
  *G11C 8/18* (2006.01)
  *H01L 25/065* (2006.01)
  *G11C 7/10* (2006.01)
  *G11C 8/12* (2006.01)
  *G11C 29/44* (2006.01)

(52) U.S. Cl.
  CPC .............. *H01L 24/16* (2013.01); *H01L 24/17* (2013.01); *H01L 25/0657* (2013.01); *H01L 25/18* (2013.01); *H01L 2224/0557* (2013.01); *H01L 2224/06181* (2013.01); *H01L 2224/16145* (2013.01); *H01L 2224/17181* (2013.01); *H01L 2225/06513* (2013.01); *H01L 2225/06541* (2013.01); *H01L 2225/06565* (2013.01); *H01L 2924/1434* (2013.01)

(58) Field of Classification Search
  CPC .......... H01L 2225/06541; H01L 2225/06565; H01L 2924/1434
  See application file for complete search history.

(56) References Cited

U.S. PATENT DOCUMENTS

| | | | |
|---|---|---|---|
| 10,930,363 B1 | 2/2021 | Nishioka | |
| 2009/0135638 A1 | 5/2009 | Shimizu | |
| 2010/0295600 A1 | 11/2010 | Kim et al. | |
| 2011/0175639 A1* | 7/2011 | Yoko | G11C 29/025 257/E23.011 |
| 2012/0069685 A1 | 3/2012 | Ide et al. | |
| 2012/0105093 A1 | 5/2012 | Lee | |
| 2012/0106229 A1 | 5/2012 | Kondo | |
| 2012/0114086 A1 | 5/2012 | Hayashi | |
| 2013/0082404 A1 | 4/2013 | Kajigaya et al. | |
| 2013/0230932 A1* | 9/2013 | Bringivijayaraghavan | H01L 23/481 438/4 |
| 2013/0294184 A1* | 11/2013 | Yang | G11C 29/04 365/200 |
| 2015/0206825 A1 | 7/2015 | Park | |
| 2015/0262648 A1 | 9/2015 | Nishioka et al. | |
| 2015/0363258 A1 | 12/2015 | Shin et al. | |
| 2016/0064357 A1 | 3/2016 | Choe et al. | |
| 2017/0110169 A1 | 4/2017 | Kim et al. | |
| 2017/0110206 A1 | 4/2017 | Ryu et al. | |
| 2017/0154655 A1 | 6/2017 | Seo | |
| 2017/0227605 A1 | 8/2017 | Kim et al. | |
| 2017/0301667 A1 | 10/2017 | Or-bach et al. | |
| 2018/0122686 A1 | 5/2018 | Or-bach et al. | |
| 2018/0247876 A1 | 8/2018 | Kim et al. | |
| 2018/0277216 A1 | 9/2018 | Inoue et al. | |
| 2019/0067359 A1 | 2/2019 | Matsumoto | |
| 2019/0096776 A1 | 3/2019 | Nishioka | |
| 2019/0362804 A1 | 11/2019 | Kim | |
| 2020/0027521 A1 | 1/2020 | Choi | |
| 2021/0091058 A1 | 3/2021 | Makabe | |
| 2021/0156908 A1* | 5/2021 | Yang | G01R 31/318513 |
| 2021/0183744 A1 | 6/2021 | Nishioka et al. | |

OTHER PUBLICATIONS

PCT Patent Application PCT/US20/52007 titled "TSV Auto Repair Scheme on Stacked Die" filed Sep. 22, 2020.
U.S. Appl. No. 16/576,647 titled "TSV Check Circuit With Replica Path" filed Sep. 19, 2019.
U.S. Appl. No. 16/590,760 titled "Memory Core Chip Having TSVS" filed Oct. 2, 2019.
U.S. Appl. No. 17/164,454, titled "Memory Core Chip Having TSVS", dated Feb. 1, 2021.
Chou, Yung-Fa et al., "Reactivation of Spares for Off-Chip Memory Repair After Die Stacking in a 3-D IC With TSVs", IEEE Transactions on Circuits and Systems I: Regular Papers, vol. 60, No. 9, Sep. 2013, pp. 2343-2351.
Lee, Changwook et al., "A New Fuse Architecture and a New Post-Share Redundancy Scheme for Yield Enhancement in 3-D Stacked Memories", IEEE Transactions on Computer-Aided Design of Integrated Circuits and Systems, vol. 33, No. 5, May 2014, pp. 786-797.

* cited by examiner

TSV AUTO REPAIR SCHEME ON STACKED DIE

CROSS-REFERENCE TO RELATED APPLICATION

This application is a continuation of U.S. patent application Ser. No. 16/590,789, filed Oct. 2, 2019. This application Is incorporated by reference herein in its entirety and for all purposes.

BACKGROUND

A semiconductor chip used in a memory device such as an HBM (High Bandwidth Memory) often includes many TSVs (Through Silicon Mas) provided to penetrate through a semiconductor substrate. The TSVs provided on each semiconductor chip are connected to TSVs provided on another semiconductor chip and located at same planar positions via microbumps and pad electrodes, respectively thereby forming signal paths penetrating through a plurality of semiconductor substrates. In a case where a certain TSV is in a poor conduction state or there is poor connection at a connection portion between two TSVs, an associated signal path is defective and cannot be practically used. Is this case, a spare signal path is used instead of the defective signal path to recover the defect. Check of each signal path and replacement thereof with a spare signal path are performed not only at the manufacturing stage but may also be performed during an initialization period after power activation in a practical use.

However, if the circuit scale of a circuit required to check the signal paths during the initialization period is large or a great number of TSVs me additionally requited, a problem of an increase in the chip size occurs.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
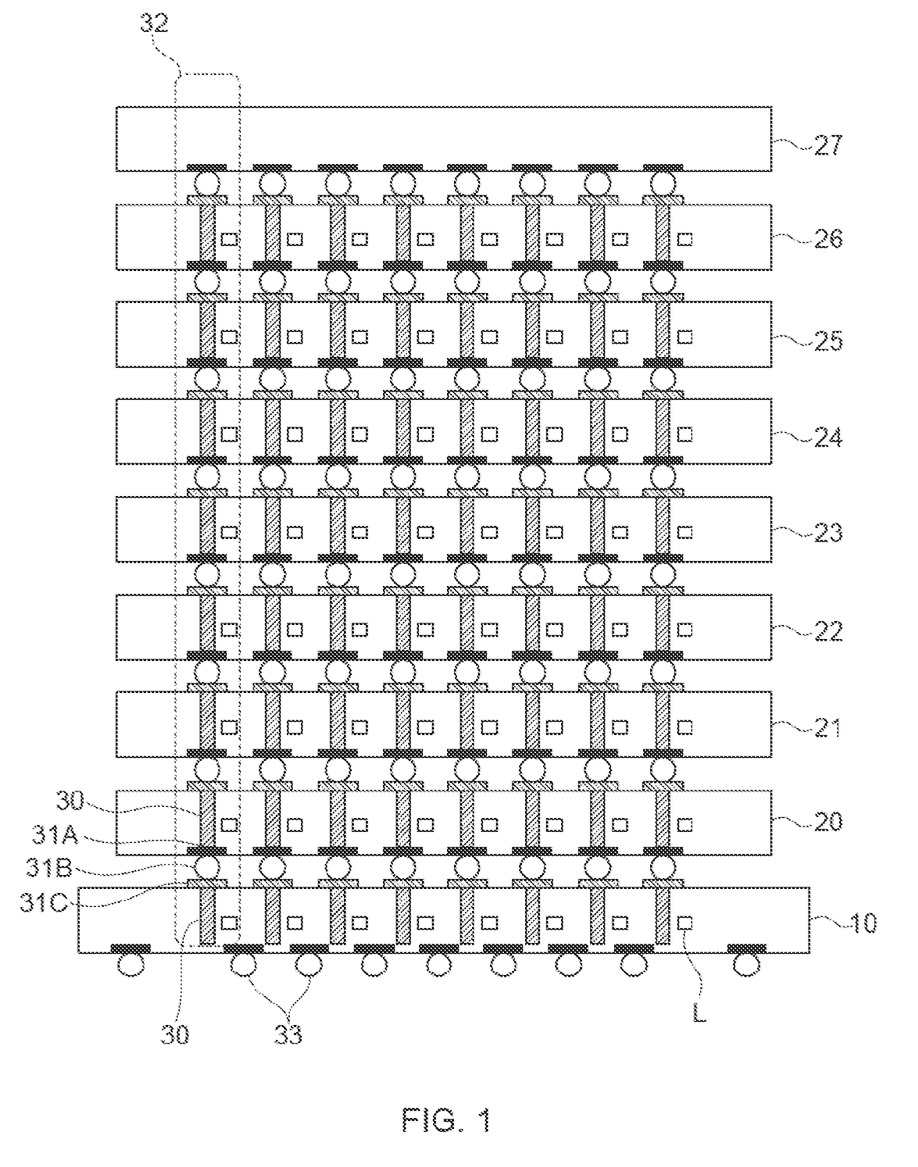
FIG. 1 is a schematic diagram showing a configuration of a semiconductor device seconding to the present disclosure.

A semiconductor device shown in FIG. 1 is an HBM having a structure in winch eight memory core chips 20 to 27 are stacked one on top of another on an interface chip 10. However, subject matters of the present invention are not limited to the HBM. The memory core chips 20 to 27 are semiconductor chips on each of which memory cores each including a memory cell array are integrated. The interlace chip 10 is a semiconductor chip that controls the memory core chips 20 to 27. Bach of the interface chip 10 and the memory core chips 20 to 26 includes a plurality of TSVs 30 provided to penetrate through the corresponding semiconductor substrate. The interface chip 10 and the memory core chips 20 to 27 are all stacked by a face-down method, that, is, in such a mantas' that principal surfaces on which transistors and wiring patterns (all not shown) are framed face downward. Accordingly, the memory core chip 27 located in the topmost layer does not need the TSVs 30. However, the memory core chip 27 located in the topmost layer may include the TSVs 30. Most of the TSVs 30 provided cm the memory core chips 20 to 26 are connected to front TSV pads 31A located at same planar positions, respectively. In contrast thereto, majorities of the TSVs 30 provided on the interface chip 10 and the front TSV pads 31A provided on the interface chip 10 are located at different planar positions. The TSVs 30 located at the same planar positions among the TSVs 30 provided on the interface chip 10 and the memory core chips 20 to 26 are respectively cascade connected via the front TSV pads 31A, TSV humps 31B, and hack TSV pads 31C, so that a plurality of signal paths 32 are formed. Commands and write data output from the interface chip 10 are supplied to the memory core chips 20 to 27 via the signal paths 32. Read data output from the memory core chips 20 to 27 are supplied to the interface chip 10 via the signal paths 32. External terminals 33 are provided on the interface chip 10 and transmission/reception of signals to/from an external circuit is performed via the external terminals 33.

Some of the signal paths 32 are spare signal paths. The spare signal paths are used when a certain signal path 32 has a defect. As shown in FIG. 1, latch circuits L are assigned to the TSVs, respectively, and fail information is stored in latch circuits L corresponding to respective TSVs 30 in a defective signal path 32.

Figure 2:
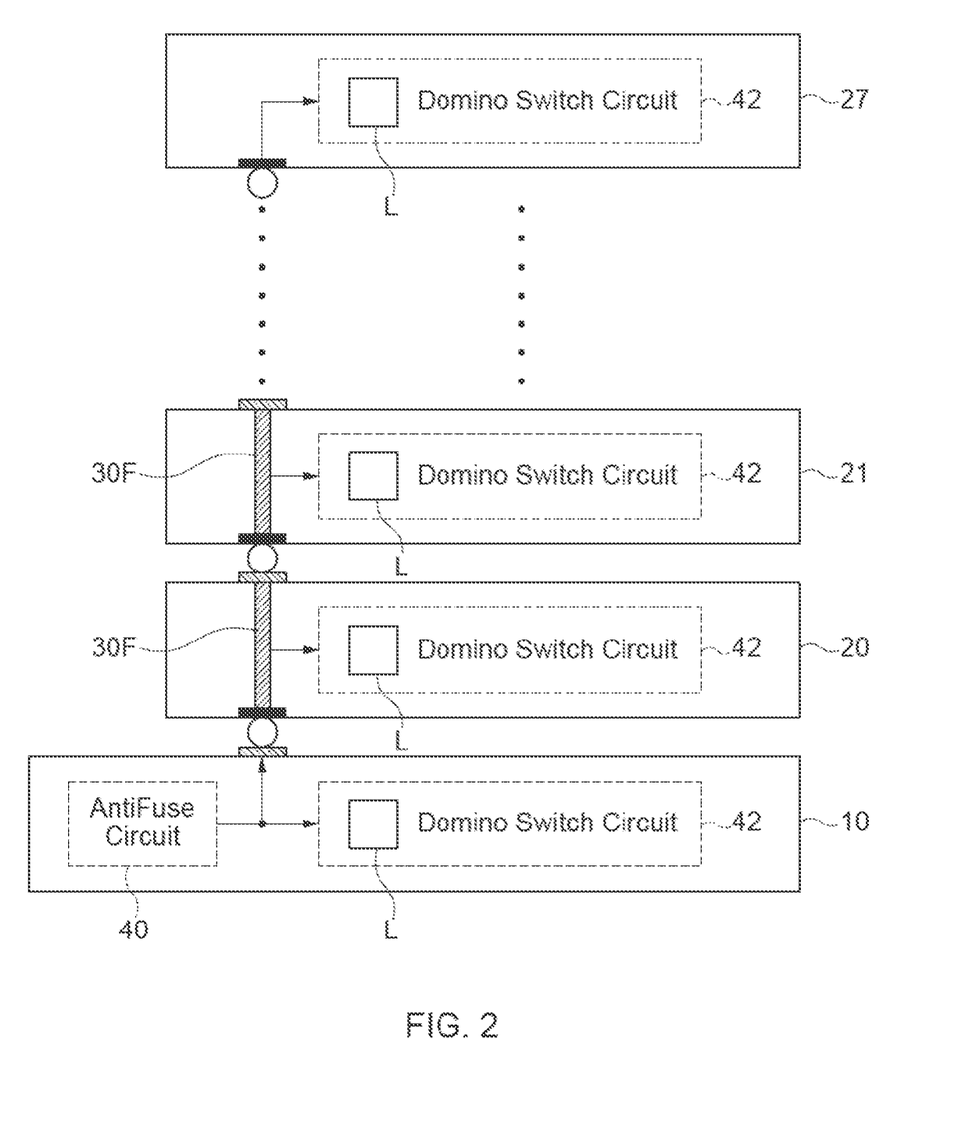
FIG. 2 is a schematic diagram for explaining a state where fail information is loaded into a domino switch circuit of etch of chips.

When the fail information is stored in the latch circuits L, connection relations between an internal circuit of the interface chip 10 and internal circuits of the memory axe chips 20 to 27, and the TSVs 30 are switched, so that a spare signal path is used instead of the defective signal path. As shown in FIG. 2, a domino switch circuit 42 is provided is each of the interface chip 10 and the memory core chips 20 to 27. The domino switch circuits 42 are circuits for switching the connection relations between, the internal circuit of the interface chip 10 and the internal circuits of the memory core chips 20 to 27, and the TSVs 30 and the connection relations between the internal circuit of the interface chip 10 and the internal circuits of the memory core chips 20 to 27, and the TSVs 30 are switched on the basis of the fail information stored in the fetch circuits L. The fed information is first read from an antifuse circuit 40 during an initialization period after power activation and is leaded in common into the fetch circuits L of the interface chip 10 and the memory core chips 20 to 27. Transfer of the fail information is perforated through TSVs 30F for fail information transfer. Witting of the fail information to the antifuse circuit 40 is performed on the basis of a result of a screening test performed at the manufacturing stage.

Figure 3A:
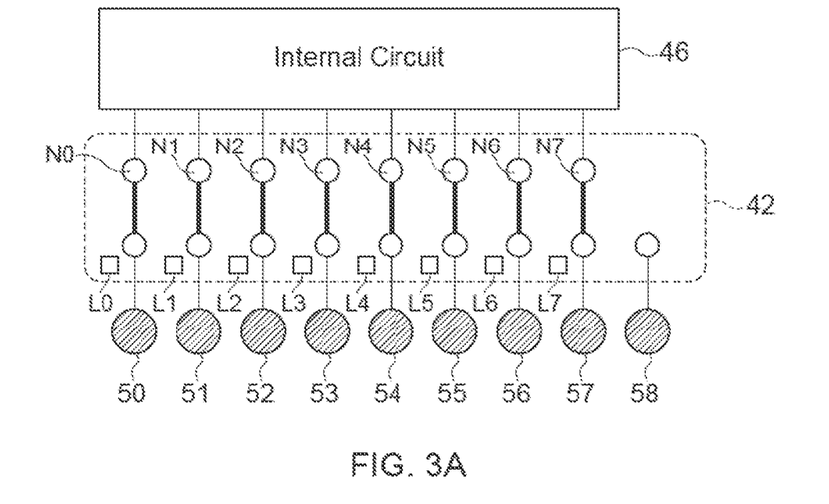
FIG. 3A is a schematic diagram far explaining a connection relation in a state where replacement by the domino switch circuit is not performed.
Figure 3B:
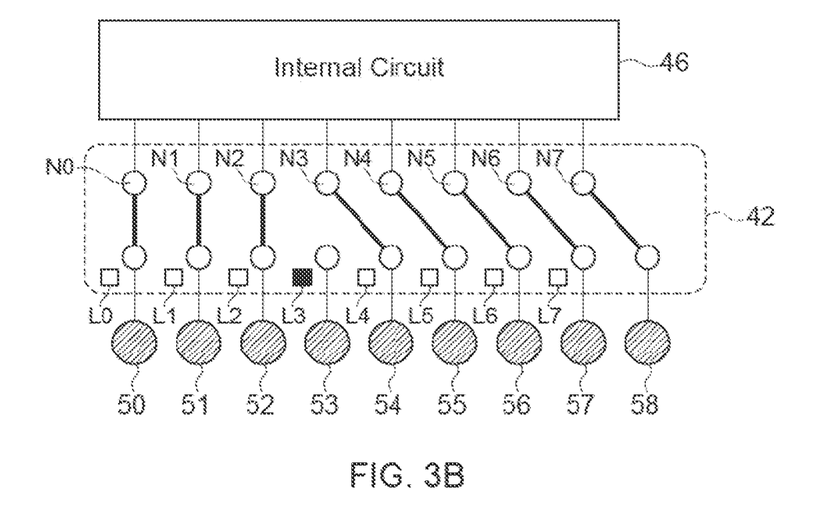
FIG. 3B is a schematic diagram for explaining a connection relation in a state where replacement by the domino switch circuit is performed.

As shown in FIG. 3A, each of the domino switch circuits 42 is connected between a plurality of input/output nodes of an internal circuit 46 and a plurality of the TSVs 30. In an example shown in FIG. 3A, the internal circuit 46 has eight input/output nodes N0 to N7 and nine TSVs 50 to 58 are assigned correspondingly thereto. Among these TSVs, eight TSVs 50 to 57 are original TSVs and one TSV 58 is a spare TSV. Corresponding latch circuits L0 to L7 are respectively assigned to the TSVs 50 to 57. In the example shown in FIG. 3A, the fail information is not stored in the latch circuits L0 to L7. In this case, the domino switch circuit 42 connects the input/output nodes NO to N7 and the TSVs 50 to 57, respectively. Therefore, the spare TSV 58 is not used in this case. In contrast thereto, when the fail information is stored in, for example, the latch circuit 13 as shown in FIG. 3B, the domino switch circuit 42 connects the input/output nodes NO to N7 and the TSVs 50 to 52 and 54 to 58, respectively. Accordingly, the TSV 53 corresponding to the latch circuit L3 is invalidated. In this way, the domino switch circuits 42 achieve recovery of a defect by shifting the connection relation between the input/output nodes NO to N7 and the TSVs 50 to 58, without simply replacing a TSV to which the fail information is assigned with the spare TSV.

The semiconductor device according to the present disclosure performs an auto repair operation after loading the fail information mad from the antifuse circuit 40 during the initialization period after power activation into the latch circuits L of the interface chip 10 and the memory cots chips 20 to 27. The auto repair operation is a training operation to test respective connection states of the signal, paths 32 and overwrite the fail information to the latch circuits L on the basis of a result of the test. A defect, on a signal path is found in a screening test performed at the manufacturing stage and the fail information is written to the antifuse circuit 40 on the basis thereof. Accordingly, a defective signal path is replaced with a spare signal path. However, there are rare cases where a defective signal path newly emerges due to temporal, changes alter shipment. An operation to find such a defect emerging afterward and to replace a defective signal path with a spare signal path is the auto repair operation. Because the auto repair operation needs to be finished during the initialization period after power activation, the trine allocable to one signal path 32 is quite short. In the present, embodiment, an auto repair circuit is incorporated in the interface chip 10 and the memory core chips 20 to 27 to automatically perform the auto repair operation without the need of control by an external controller.

Figure 4:
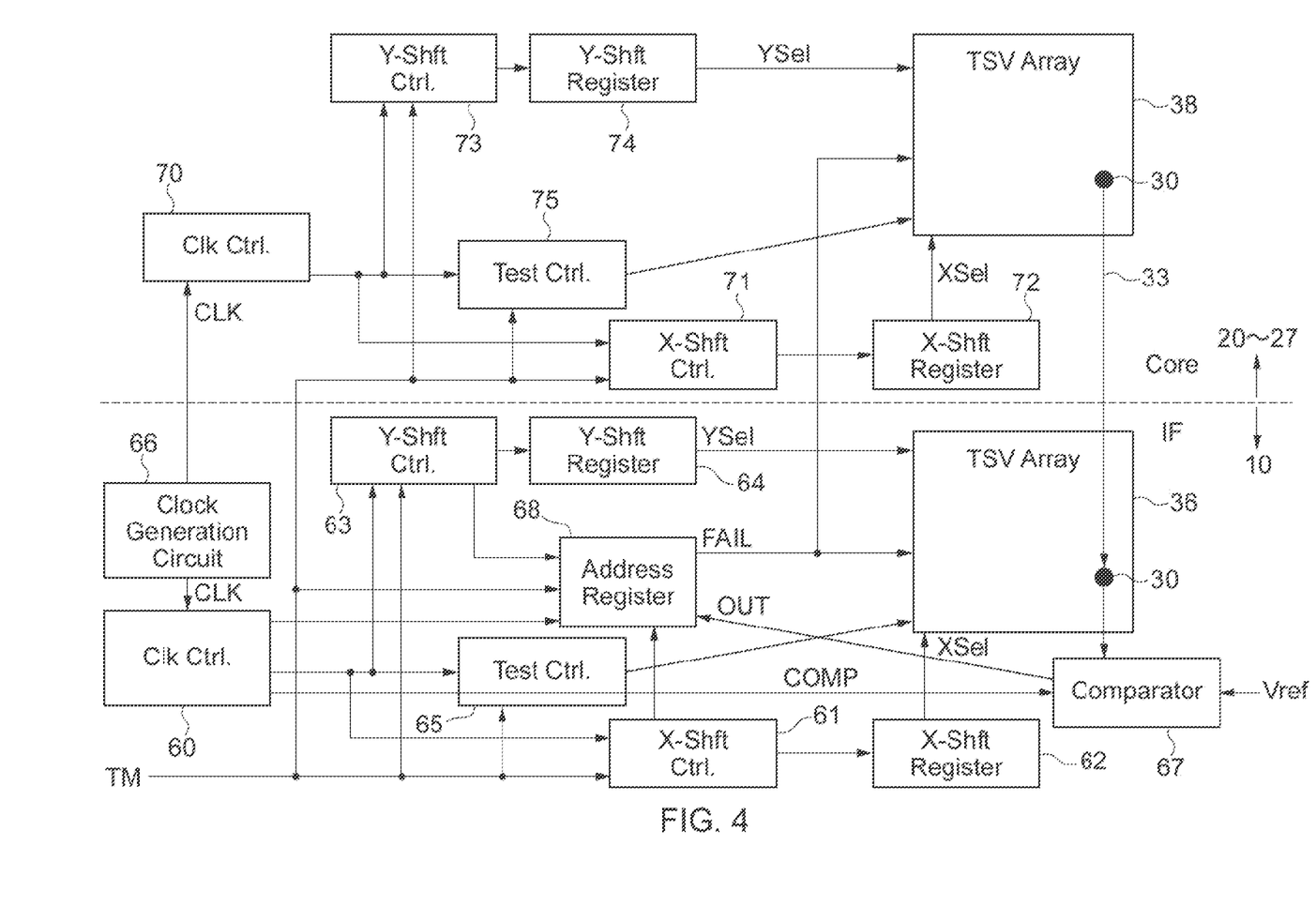
FIG. 4 is a block diagram for explaining a configuration of an auto repair circuit.

As shown in FIG. 4, the auto repair circuit is provided in the interface chip 10 and the memory core chips 20 to 27. A clock control circuit 60, an X-address control circuit 61, an X-shift register 62, a Y-address control circuit 63, a Y-shift register 64, and a test control circuit 65 are provided in the interface chip 10. A clock control circuit 70, an X-address control circuit 71, an X-shift register 72, a Y-address control circuit 73, a Y-shift register 74, and a test control circuit 75 are provided in each of the memory core chips 20 to 27. The aforementioned circuits 60 to 65 provided in the interface chip 10 and the aforementioned circuits 70 to 75 provided in each of the memory core chips 20 to 27 have same circuit configurations, respectively. The interface chip 10 further includes a clock generation circuit 66, a comparator 67, and an address register 68. The clock generation circuit 66 includes an oscillator and automatically generates a test clock signal CLK. The test clock signal CLK is supplied in the clock control circuit 60 included in the interface chip 10 and is also supplied to the clock control circuit 70 included in each of the memory core chips 20 to 27. The clock control circuit 60 controls operation timings of the X-address control circuit 61, the Y-address control circuit 63, the test control circuit 65, and the address register 68. The clock control circuit 70 controls operation timings of the X-address control circuit 71, the Y-address control circuit 73, and the test control circuit 75. A test of the auto repair operation can also be performed by inputting a test mode signal TM to these circuits 61, 63, 65, 71, 73, and 75.

The comparator 67 is a circuit that compares the potential of a selected signal path 32 with, a reference potential Vref. The comparator 67 compares the potential of the selected signal path 32 with the reference potential Vref at a timing when a comparison signal COMP is activated, and generates an output signal OUT on the basis of a result of the comparison. The output signal OUT is supplied to the address register 68. The address register 68 generates a fail signal FAIL on the basis of the output signal. OUT. The fail signal FAIL is supplied in common to TSV areas 36 and 38. The address register 68 further retains the address of a defective signal path 32, thereby also performing a determination operation to determine whether a defective signal path 32 can be recovered fey a spare signal path when the fail signal FAIL is activated next. The address retained in the address register 68 may be readable to outside by a test mode operation.

The TSVs 30 provided on the interface chip 10 are arranged in an army in the TSV area 36. Any one of the TSVs 30 arranged in an array in the TSV area 36 can be selected using a TSV selection signal Xsel output from the X-shift register 62 and a TSV selection signal Ysel output from the Y-shift register 64. Similarly, the TSVs 30 provided an each of the memory core chips 20 to 27 are arranged in an array in the TSV area 38. Any one of the TSVs arranged in an stray in the TSV area 38 can be selected using a TSV selection signal Xsel output from the X-shift register 72 and a TSV selection signal Ysel output from the Y-shift register 74.

Figure 5:
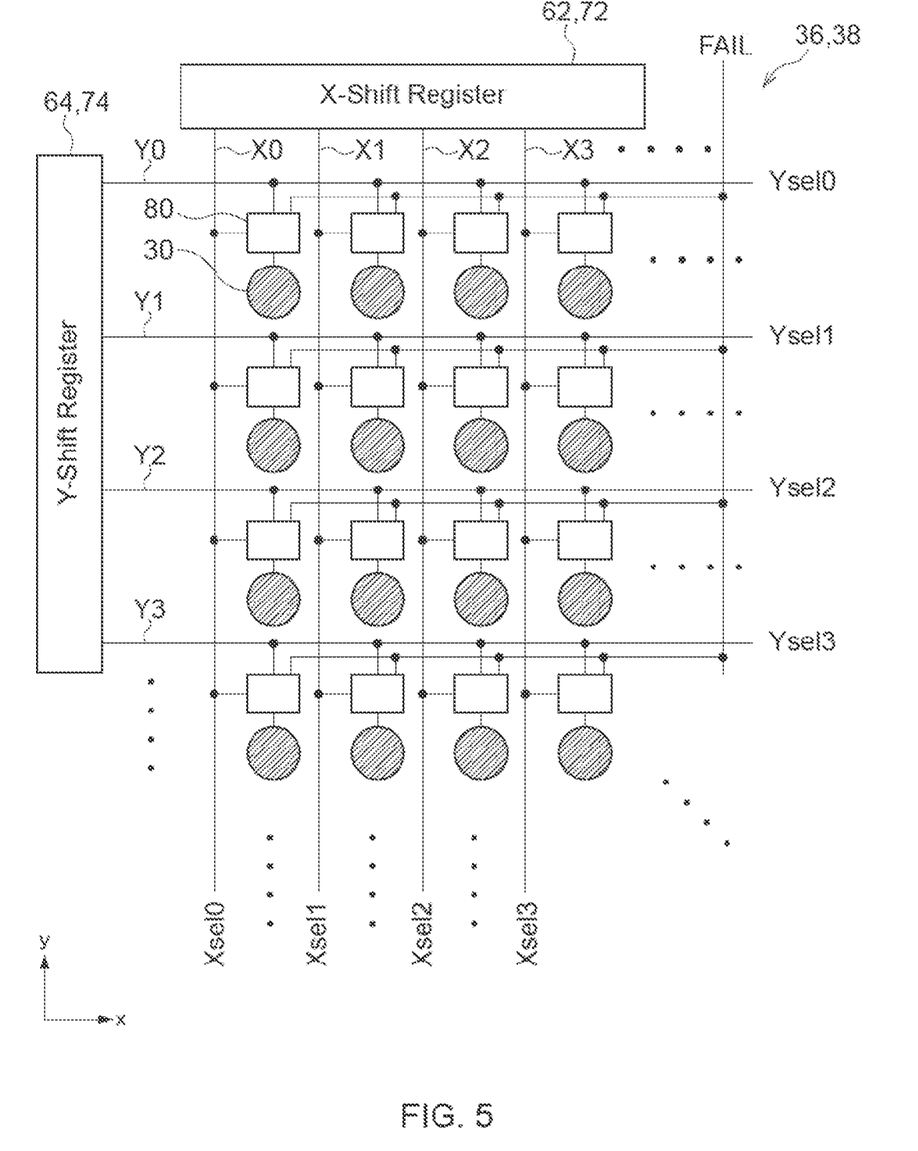
FIG. 5 is a schematic plan view showing a layout of TSV's in TSV areas.

As shown in FIG. 5, the TSVs 30 are laid out in a matrix, in the TSV areas 36 and 38. A selection circuit 80 is assigned to each of the TSVs 30. The selection circuits 80 are used in a check of the signal paths 32, which is performed at the manufacturing stage and during the initialization period after power activation. As shows in BIG 5, corresponding selection signal lines Y0, Y1, Y2, Y3, . . . are assigned to pluralities of TSVs 30 arrayed in an x direction, respectively, and corresponding selection signal lines X0, X1, X2, X3, . . . are assigned to pluralities of TSVs 30 arrayed in a y direction, respectively. The selection signal, lines Y0, Y1, Y2, Y3, . . . supply TSV selection signals Ysel0, Ysel1, Ysel2, Ysel3, . . . to corresponding ones of the selection circuits 80, respectively. The selection signal lines X0, X1, X2, X3, . . . supply TSV selection signals Xsel0, Xsel1, Xsel2, Xsel3, . . . to corresponding ones of the selection circuits 80, respectively. The Y-shift registers 64 and 74 activate any one of the TSV selection signals Ysel0, Ysel1, Ysel2, Ysel3, . . . and deactivate all the other TSV signals. The X-shift registers 62 and 72 activate any one of the TSV selection signals Xsel0, Xsel1, Xsel2, Xsel3, . . . and deactivate ail the other TSV selection signals. Accordingly, any one of the selection circuits 80 is activated and a TSV 30 corresponding thereto is selected.

Figure 6:
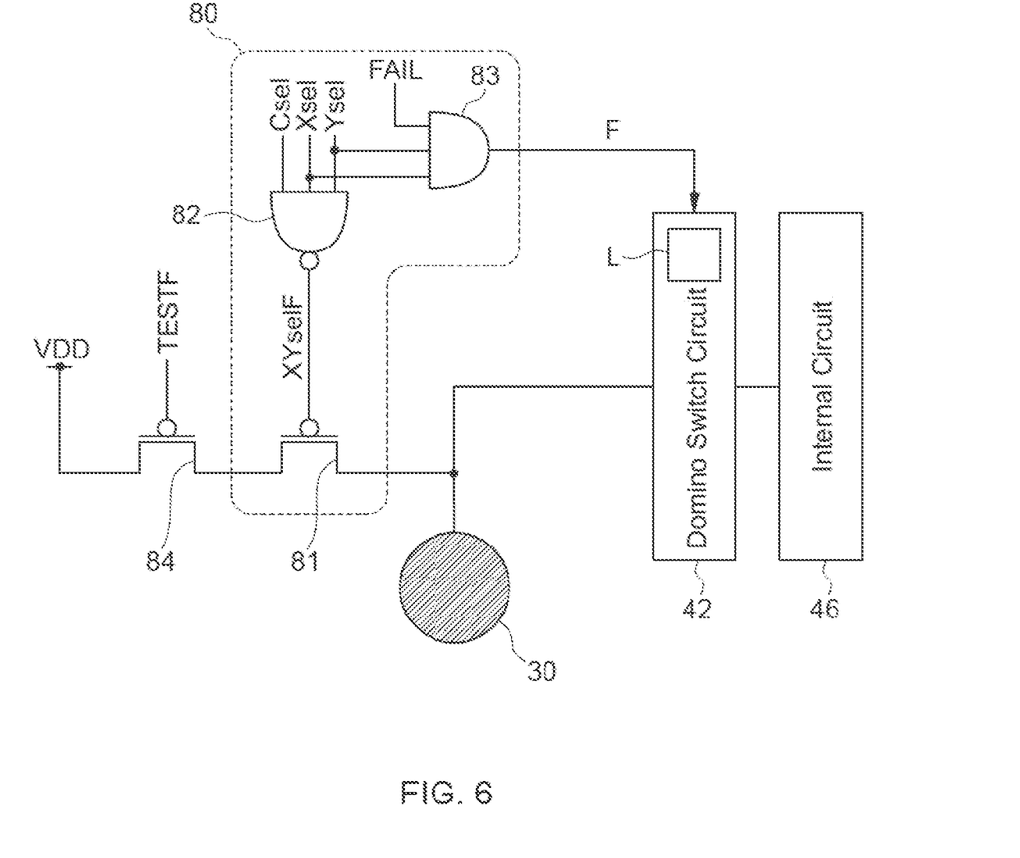
FIG. 6 is a circuit diagram of a selection circuit included in memory core chips.

Each of the selection circuits 80 included in the memory core chips 20 to 27 includes a P-channel MOS transistor 81, a NAND gate circuit 82 that control the transistor 81, and an AMD gate circuit 83 that controls the corresponding latch circuit L included in the domino switch circuit 42 as shown in FIG. 6. The NAND gate circuit 82 receives a corresponding one of the TSV selection signals Xsel0, Xsel1, Xsel2, Xsel3, . . . a corresponding one of the TSV selection signals Ysel0, Ysel1, Ysel2, Ysel3, . . . , and one of memory core selection signals Csel0, Csel1, Csel2, Csel3, . . . for selecting one of the memory core chips 20 to 27, and activates a TSV selection signal XYselF to a low level when these selection signals are all in an active level (a high level). In the memory core chips 20 to 27, a P-channel MOS transistor 84 and the P-channel MOS transistor 81 are connected in series between a power supply VDD and the TSVs 30. A gate electrode of the transistor 84 is supplied with a test signal TESTF. The test signal TESTF is a signal activated at the time of an auto repair operation. Accordingly, when both the test signal TESTF and the TSV selection signal XYselF are activated to a tow level, an associated one of the TSVs 30 is connoted to the power supply VDD. The power supply VDD is, for example, a power supply on a high potential sale and an associated signal path 32 is charged via the TSV 30 in this case when both the test signal TESTF and the TSV selection signal XYselF are activated.

The AND gate circuit 83 receives the corresponding one of the TSV selection signals Xsel0, Xsel1, Xsel2, Xsel3, the corresponding one of the TSV selection signals Ysel0, Ysel1, Ysel2, Ysel3, and the fail signal FAIL and activates a flag F to a high level when these signals are all in an active level (a high level). The flag F is supplied to the domino switch circuit 42 and the fail information is accordingly written to one of the latch circuits L corresponding to the associated TSV 30.

Figure 7:
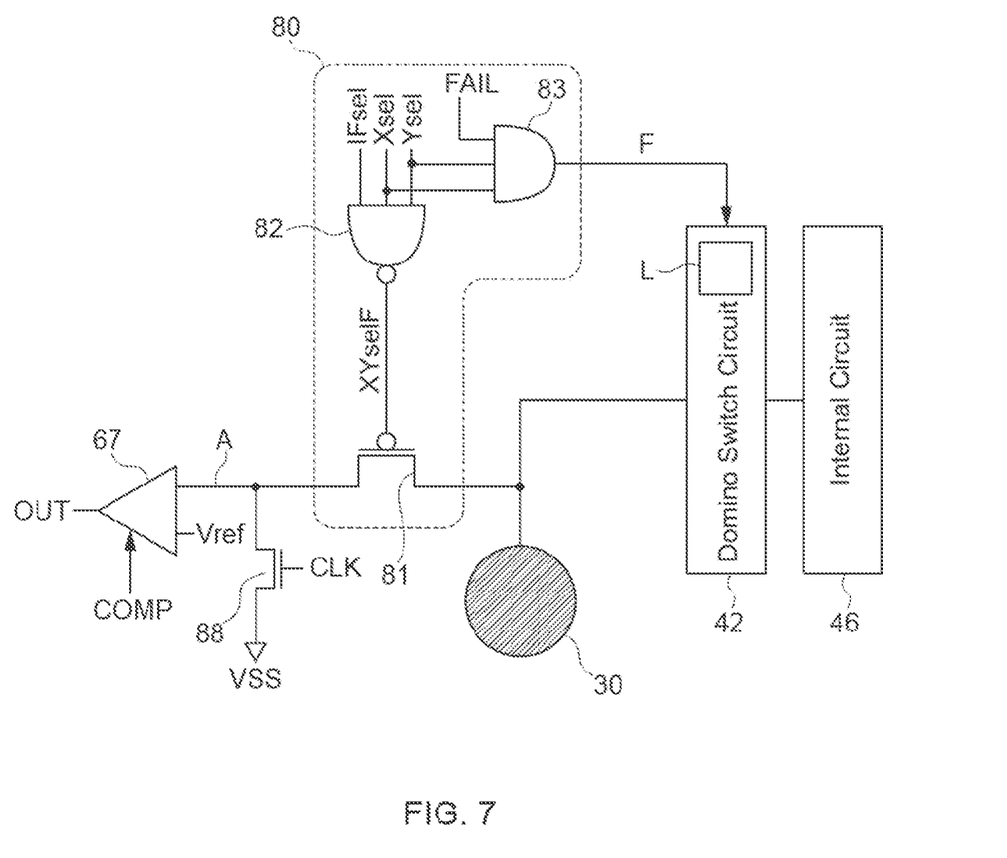
FIG. 7 is a circuit diagram of a selection circuit included in an interface chip.

The selection circuits 80 included in the interface chip 10 have a same circuit configuration to that of the selection circuits 80 in the memory core chips 20 to 27 as shown in FIG. 7 except that an interface chip selection signal IFsel is used instead of the memory corn selection signals Csel0, Csel1, Csel2, Csel3, . . . . In the interface chip 10, the transistor 81 and an N-channel MOS transistor 88 are connected in series between the TSVs 30 and a power supply VSS. A gate electrode of the transistor 88 is supplied with the test clock signal CLK. According when the test clock signal CLK is activated to a high level and the TSV selection signal XYselF is activated to a low level, an associated one of the TSVs 30 is connected to the power supply VSS. The power supply VSS is, far example, a power supply on a low potential side- and an associated signal path 32 is discharged via the TSV 30 in this case when both the test clock signal CLK and the selection signal XYselF are activated.

As shown in FIGS. 6 and 7, the domino switch circuit 42 is connected between the internal circuit 46 included in the interface chip 10 or the memory cote chips 20 to 27 and the TSVs 30. The function of the domino switch circuit 42 is as explained with reference to FIGS. 3A and 3B. When the fail information is written to one of the latch circuits L, one of the TSVs 30 corresponding thereto is invalidated and a spare TSV (the TSV 58 shown in FIGS. 3A and 3B, for example) is validated instead.

Figure 8:
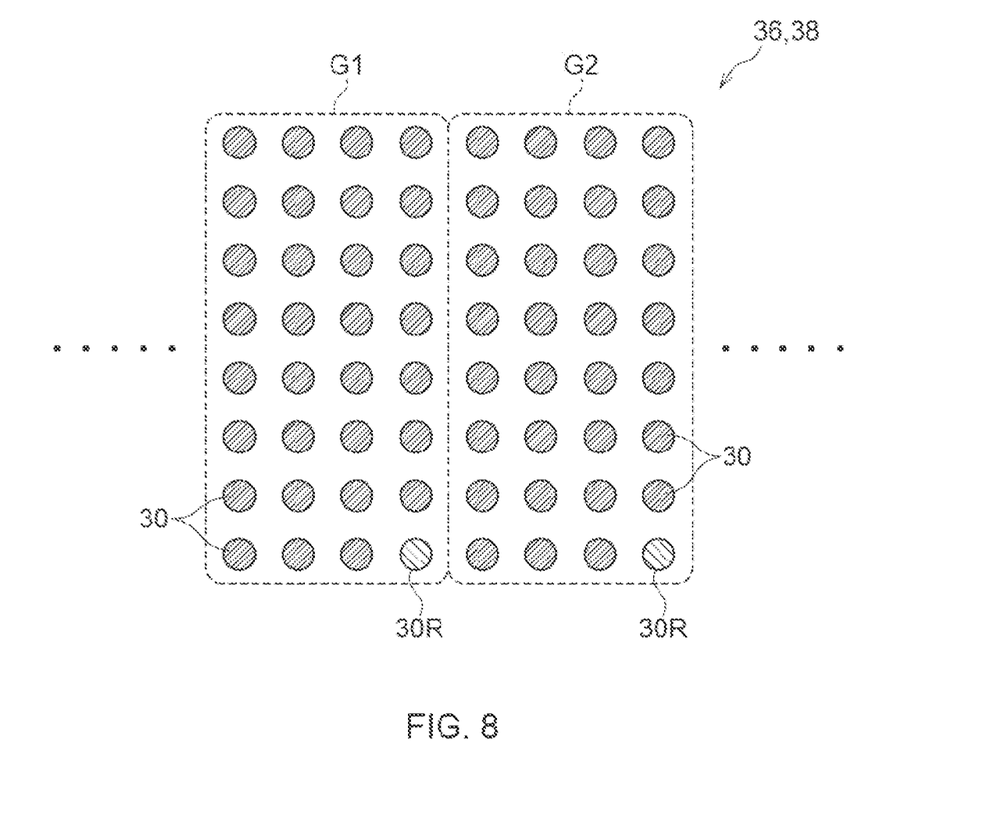
FIG. 8 is a schematic diagram for explaining grouping in the TSV areas.

As shown in FIG. 8, regular TSVs 30 located in the TSV areas 36 and 38 are divided into a plurality of groups G1, G2, . . . , and one or more span TSVs 30R are assigned to each group. Accordingly, the number of TSVs 30 that can be recovered per group is limited to the number of spare TSVs 30R included in the associated group. When generating the fad signal FAIL, the address register 68 retains the address of a signal path 32 corresponding thereto, thereby determining whether a signal path 32 can be recovered by a spare signal path when the tall signal FAIL is activated next. When a result of the determination indicates that no signal path 32 can be recovered, that is, when no spare TSV 30R belonging to the associated group remains, the fail signal FAIL is not activated.

Figure 9:
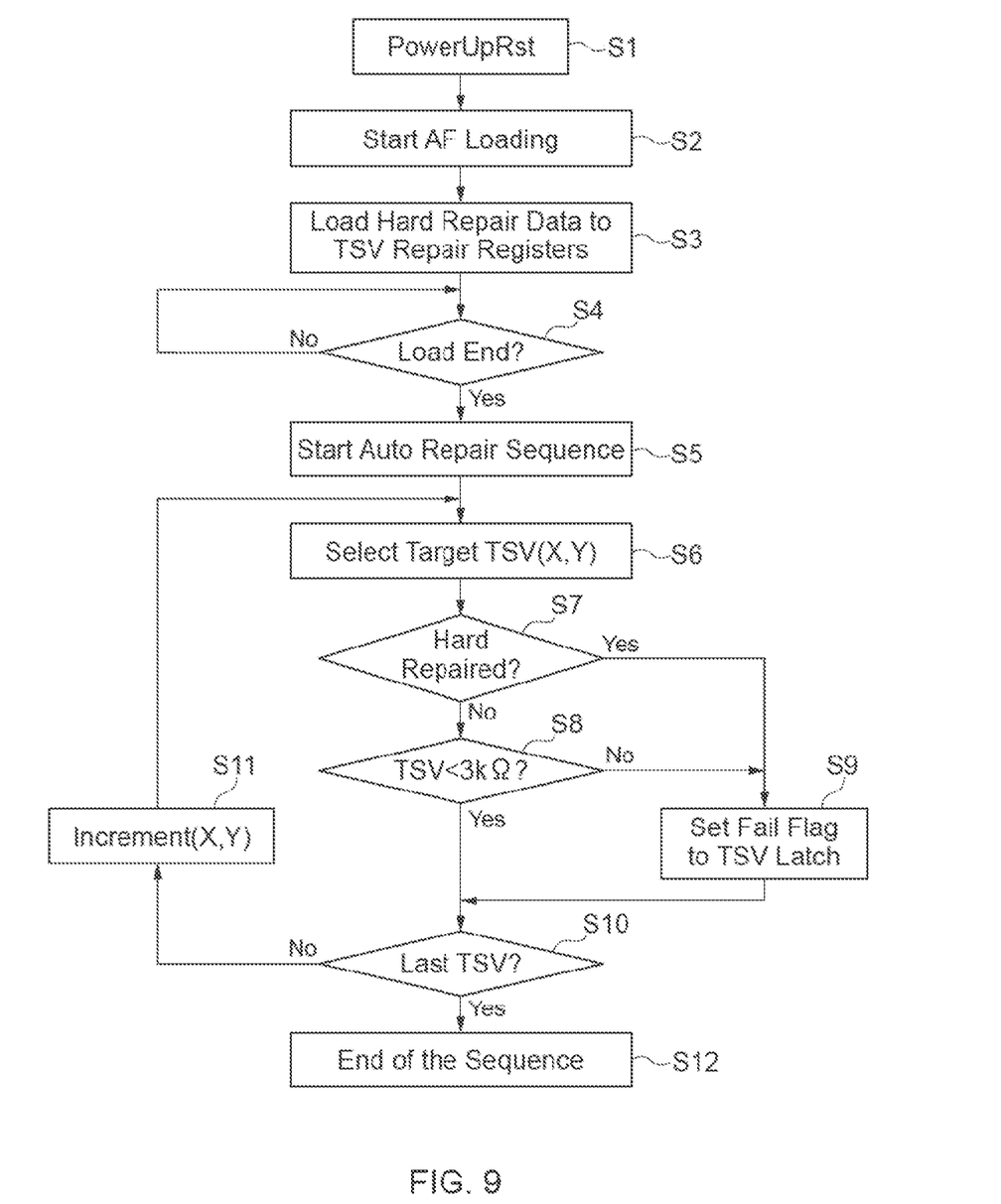
FIG. 9 is a flowchart for explaining tat auto repair operation.

The auto repair operation is explained next. As shown in FIG. 9, when the device is powered up and a reset signal PowerUpRst is activated (Step S1), the fail information is read from the antifuse circuit 40 shown in FIG. 2 (Step S2) and is loaded into the domino switch circuits 42 included in the interface chip 10 and the memory core chips 20 to 27. Accordingly, the fail information is written to onus of the latch circuits L corresponding, to a defective signal path 32 (Step S3), ones of the TSVs 30 corresponding thereto are invalidated, and a spare TSV 30R is validated. This operation is called "hard repair". When the hard repair is completed (YES at Step S4), the auto repair operation is started (Step S5). When the auto repair operation is started, the clock, control circuits 60 and 70 are activated. Accordingly, the X-shift registers 62 and 72 sequentially activate the TSV selection signals Xsel in synchronisation with the test clock signal CLK, and the Y-shift registers 64 and 74 sequentially activate the TSV selection signals Ysel in synchronization with the test clock signal CLK (Step S6). At this time, the X-shift register 62 included in the interface chip 10 and the X-shift registers 72 included in the memory core chips 20 to 27 activate same TSV refection signals Xsel, respectively, and the Y-shift register 64 included in the interface chip 10 and the Y-shift registers 74 included in the memory core chips 20 to 27 activate same TSV selection signals Ysel, respectively. That is, the interface chip 10 and the memory core chips 20 to 27 perform same operations, respectively, whereby the signal paths 22 are sequentially tested (Step S8). When it is determined as a result of the test that a signal path 32 is defective (NO at Step SB), the fail signal FAIL is activated and is latched into corresponding ones of the latch circuits L (Step S9). In an example shown in FIG. 9, it is confirmed that the resistance value of the signal path 32 is lower than 3K ohm at Step S8. However, the value to be compared with is not limited to 3K ohm and can be other values. However, as for a signal path 32 where replacement has been already performed on the basis of the fail information from the antifuse circuit 40 (YES at Step S7), the fail signal FAIL is activated regardless of the test result (Step S9). Whether the signal path 32 to be tested is the last signal path is then determined (Step S10). When the signal path 32 is not the last signal path (NO at Step S10), the TSV selection signals Xsel and Ysel are incremented (Step S11). On the other band, when the signal path 32 to be tested is the last signal path (YES at Step S10), the auto repair operation is ended (Step S12).

Figure 10:
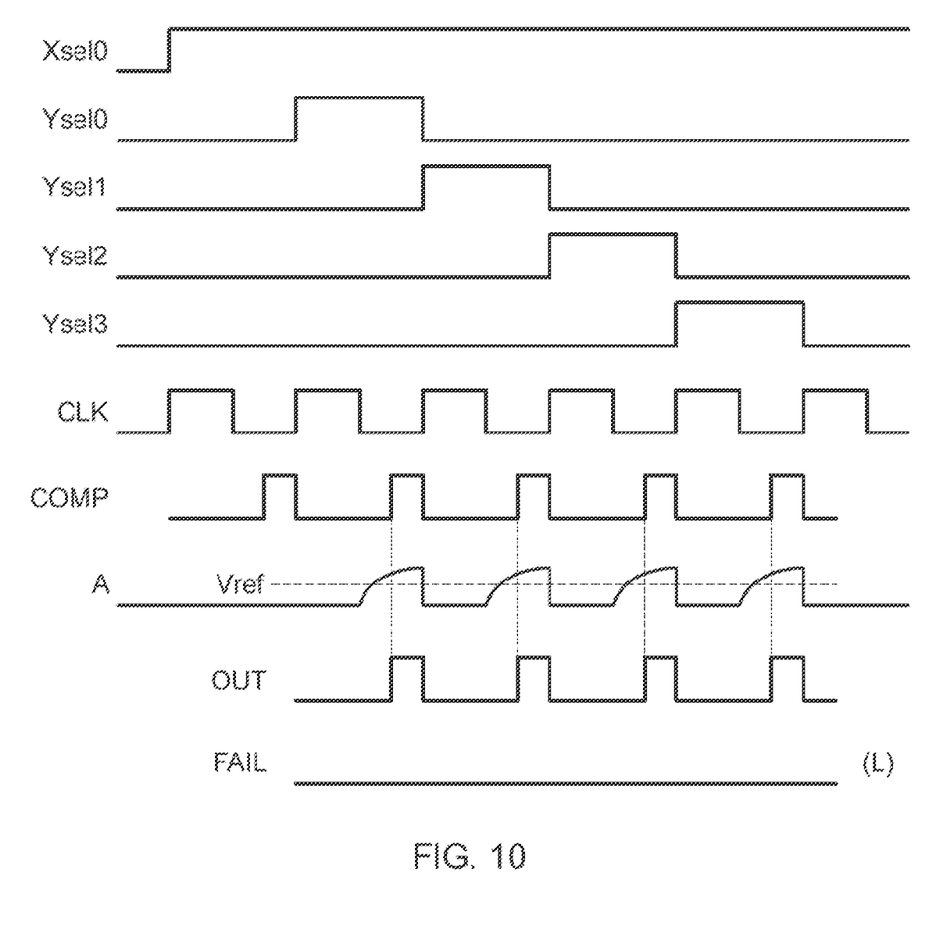
FIG. 10 is a waveform diagram, of each signal during an auto repair operation and shows waveforms in a case where respective signal paths include no defect.
Figure 11:
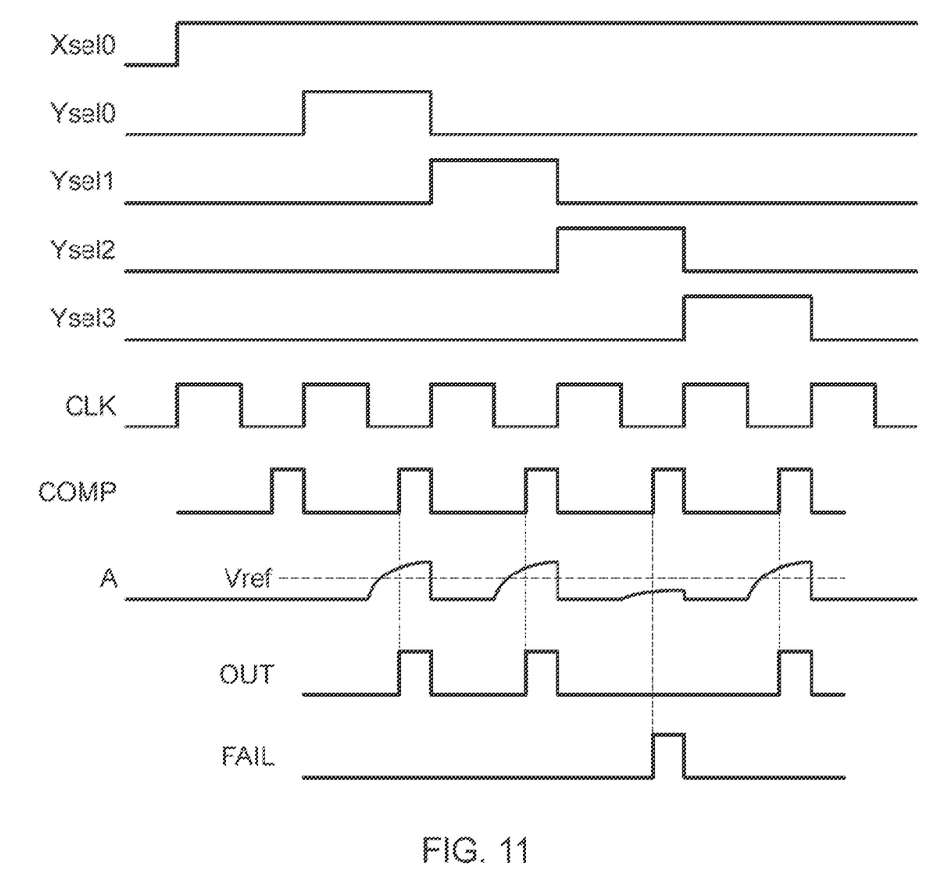
FIG. 11 is a waveform diagram of each signal during an auto repair operation and shows waveforms in a case where some of the signal paths include a defect.

Waveforms of the signals in the auto repair operation are explained with reference to FIGS. 10 and 11. FIG. 10 show's waveforms in a case where the signal paths 32 include no defect and FIG. 11 shows waveforms in a case where some of the signal paths 32 include a defect. First, the TSV selection signals Ysel0, Ysel1, Ysel2, Ysel3, . . . are sequentially activated to a high level in a state where any (the selection signal Xsel0 in the examples shown in FIGS. 10 and 11) of the TSV selection signals Xsel0, Xsel1, Xsel2, Xsel3, . . . is activated to a high level. Accordingly, a plurality of TSVs 30 arrayed in a matrix as shown in FIG. 5 are sequentially selected and an associated signal, path 32 is charged via the selected TSV 30. It suffices to perform charging of the signal path 32 in any one of the memory COPS chips 20 to 27 and charging in the other memory core chips is not required. It is preferable to perform charging of the signal pith 32 in the memory core chip 27 in the topmost layer. In this case, it suffices to activate the memory core selection signal Csel corresponding to the memory core chip 27 in the topmost layer while maintaining the memory core selection signals Csel corresponding to the other memory core chips 20 to 26 in an inactive slate.

As shown in FIGS. 10 and 11, one cycle of the test clock signal CLK is equal to an activation period of the selection signals Ysel0, Ysel1, Ysel2, Ysel3, . . . . Accordingly, the transistor 88 is on during the former half of a period in which one signal path 32 is selected, so that the selected signal path 32 is discharged and a node A in the interface chip 10 becomes a VSS level. Meanwhile, the transistor 88 is off during the latter half of the period in which one signal path 32 is selected, so that discharging of the selected signal path 32 stops. When discharging of the signed path 32 stops, a signal path 32 selected, via the transistor 81 is charged and therefore the level of the node A in the interface chip 10 increases. At this time, the increase cate of the level of the node A depends on the resistance value and the parasitic capacitance of the signal path 32. FIG. 10 shows the waveforms in the case where the signal paths 32 include no defect and the level of the node A exceeds the reference potential Vref promptly after the test clock signal CLK changes to a low level. The comparison signal COMP is activated at a timing before the test clock signal CLK changes again to a high level after having changed from the high level to the low level. When the comparison signal COMP is activated, the comparator 67 compares the level of the node A with the reference potential Vref and sets the output signal OUT to a high level when the level of the note A is higher. This means that the signal path 32 does not include a defect, for example, the resistance value is lower than 3K ohm. In this case, the fail signal FAIL is kept in an inactive state. In the circuit examples shown in FIGS. 6 and 7, the note A is charged to VDD and then is discharged to VSS, and the level thereof is compared with the reference potential Vref in this state. However, the node A can be discharged to VSS and then be charged to VDD, and the level thereof can be compared with the reference potential Vref in this state. In this case, a signal indicating an inversion of the comparison result is used as the output signal OUT.

Meanwhile, FIG. 11 shows the waveforms in the case where a signal path 32 corresponding to the selection signals Xsel0 and Ysel2 includes a defect. When a signal path 32 includes a defect, the resistance value increases and the charging rate of the signal path 32 decreases. It is considered that a defect of a signed path 32 occurs in a case where the resistance value of an associated TSV 30 itself is increased or a case where the resistance value is increased due to a defect at a connection portion via the front TSV pads 31A, TSV bumps 31B, and back TSV pads 31C. When the resistance value of the signal path 32 is high, increase in the level of the associated node A is slowed and the level of the node A becomes lower than the reference potential Vref at a timing when the comparison signal COMP is activated. Accordingly, the comparator 67 switches the output signal OUT to a low level. This means that the signal path 32 includes a defect, for example, the resistance value is equal to or higher than 3K ohm, and the fail signal FAIL is activated in this case.

As shown in FIG. 4, the fail signal FAIL is supplied in common to the TSV areas 36 and 38 of the interface chip 10 and the memory core chips 20 to 27. That is, the fail signal FAIL is supplied to all the selection circuits 80. However, the flag F is activated on the basis of the fail signal BAIL only in ones of the selection circuits 80 in a selected stale and the flag F is not activated in the other selection circuits 80 even when the fail signal FAIL is activated. Accordingly, only the flag F corresponding to a signal path 32 to be tested is activated and the fail information is written to corresponding ones of the latch circuits L included in the domino switch circuits 42. As described above, when the fail information is whiten to the latch circuits L, the associated signal path 32 is invalidated and is replaced with a spare signal path.

As described above, in the semiconductor device according to the present disclosure, the auto repair operation is performed during the initialization period after power activation. Therefore, a signal path tot becomes defective afterward due to temporal changes is invalidated and a spans signal path is validated to enable recovery of the defect. Furthermore, to TSV selection signals Xsel and Ysel used in the auto repair operation are automatically generated inside to interface chip 10 and to memory core chips 20 to 27. Therefore, there is no treed to provide TSVs far transferring the TSV selection signals Xsel and Ysel. Further, because to determination operation using to comparator 67 and to transfer operation of the fail signal FAIL are alternately performed, the fail information can be selectively written to predetermined ones of to latch circuits L by supplying the fail signal FAIL of one hit in common to all to selection circuits 80 in to interface chip 10 and to memory core chips 20 to 27.

The auto repair operation described above cart also be performed in a screening test performed at the manufacturing stage. For example, by performing the auto repair operation after specifying a defective signal path 32 on to basis of a result of the screening test and before writing the fail information to the antifuse circuit 40, whether the auto repair operation functions normally can be tested.

Although this invention has been disclosed in to context of certain preferred embodiments and examples, it will be understood by those skilled in the an that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of to specific features and aspects of the embodiments may be made and still fall within the scope of the inventions. It should be understood that various features and aspects of the disclosed embodiments can be combined with or substituted for one another in order to form varying mode of to disclosed invention. Thus, it is intended that the scope of at least some of the present invention herein disclosed should not be limited by the particular disclosed embodiments described above.

The invention claimed is:

1. An apparatus comprising:
   a first semiconductor chip including a plurality of pad electrodes, a plurality of first latch circuits assigned to an associated one of the plurality of pad electrodes, and a spare pad electrode; and
   a second semiconductor chip including a plurality of TSVs each electrically coupled to an associated one of the plurality of pad electrodes to form a plurality of signal paths, a plurality of second latch circuits assigned to an associated one of the TSVs, and a spare TSV,
   wherein the first semiconductor chip further includes a comparison circuit configured to compare a potential of a signal path of the plurality of signal paths with a reference potential and provide a fail signal based on the comparison, wherein the fail signal is indicative of a defect in the signal path and is provided to the first semiconductor chip and the second semiconductor chip, and wherein responsive to the fail signal, the defective signal path is invalidated and a spare signal path including the spare pad electrode and the spare TSV is validated.

2. The apparatus of claim 1, wherein the first semiconductor chip further comprises:
   a clock generation circuit configured to generate a clock signal;
   a first selection circuit formed on the first semiconductor chip and configured to provide a first selection signal based on the clock signal, wherein one of the pad electrodes and one of the first latch circuits is selected based on the first selection signal; and
   a second selection circuit configured to provide a second selection signal based on the clock signal, wherein one of the TSVs and one of the second latch circuits is selected based on the second selection signal.

3. The apparatus of claim 1, wherein the first semiconductor chip and the second semiconductor chip each further comprises a switch circuit, wherein the switch circuit is configured to switch a connection relation between the first semiconductor chip and the second semiconductor chip based on an indication of fail information.

4. The apparatus of claim 3, wherein the second semiconductor chip comprises an antifuse circuit, wherein during an initialization period after power activation, the fail information is read from the antifuse circuit and is loaded in common into the plurality of first latch circuits and the plurality of second latch circuits.

5. The apparatus of claim 1, wherein the comparison circuit is configured to compare the potential of the signal path of the plurality of signal paths with the reference potential at a time when a comparison signal is activated and further configured to generate an output signal based on a result of the comparison.

6. The apparatus of claim 5, wherein the output signal is supplied to an address register on the first semiconductor chip.

7. The apparatus of claim 6, wherein the address register is configured to generate the fail signal provided in common to TSV areas in the first semiconductor chip and the second semiconductor chip.

8. A method comprising:
   activating a row selection signal and a column selection signal in synchronization with a test clock signal in a first semiconductor chip and a second semiconductor chip, wherein the first semiconductor chip includes a plurality of TSVs arranged in row and column directions and a plurality of first latch circuits, each first latch circuit of the plurality of first latch circuits corresponding to a respective of the plurality of TSVs and wherein the second semiconductor chip includes a control circuit and a plurality of pads coupled correspondingly to the plurality of TSVs;
   testing a plurality of signal paths between the first semiconductor chip and the second semiconductor chip; and
   activating a fail signal indicative of a defective signal path and latching the fail signal into corresponding ones of the latch circuits in the first semiconductor chip and the second semiconductor chip.

9. The method of claim 8, farther comprising:
   reading fail information from an antifuse circuit included in the first semiconductor chip and loading the fail information into switch circuits included in the first semiconductor chip and the second semiconductor chip, wherein the second semiconductor chip comprises a plurality of second latch circuits; and
   writing the fail information to ones of the plurality of first latch circuits and the plurality of second latch circuits corresponding to the defective signal path between the first semiconductor chip and the second semiconductor chip, wherein ones of a plurality of TSVs corresponding thereto are invalidated and a spare TSV is validated.

10. The method of claim 9, further comprising activating a flag signal based on the fail information in the antifuse circuit regardless of a test result from testing the plurality of signal paths between the first semiconductor chip and the second semiconductor chip.

11. The method of claim 10, further comprising comparing a resistance value of the signal path to a reference resistance value, wherein responsive to the resistance value of the signal path exceeding the reference resistance value, the fail signal is activated.

12. The method of claim 8, further comprising determining whether a signal path being tested is a last signal path, wherein when the signal path being tested is not the last signal path, the row selection signal and the column selection signal are incremented.

13. The method of claim 8, wherein the second semiconductor chip is stacked on the fast semiconductor chip.

14. An apparatus comprising:
    a first semiconductor chip including a plurality of pad electrodes and a first switch circuit;
    a second semiconductor chip stacked on the first semiconductor chip, wherein the second semiconductor chip including a second switch circuit and a plurality of TSVs comprising a spare TSV, each TSV of the plurality of TSVs coupled to an associated one of the plurality of pad electrodes to form a plurality of signal paths, the second semiconductor chip further including a selection circuit configured to selectively activate the spare TSV, wherein the selection circuit comprises:
    a first transistor coupled to the plurality of TSVs;
    a first gate circuit configured to provide a TSV selection signal to the first transistor based on corresponding TSV row and column selection signals and a core selection signal; and
    a second gate circuit configured to control a corresponding latch circuit included in the second switch circuit.

15. The apparatus of claim 14, wherein the fast gate circuit is further configured to provide the TSV selection signal at a low level responsive to the corresponding TSV row and column selection signals and the core selection signal being active.

16. The apparatus of claim 14, wherein the first transistor of the selection circuit is coupled to a second transistor in series between a power supply and the plurality of TSVs, wherein the second transistor is provided with a test signal.

17. The apparatus of claim 16, wherein an associated one of the plurality of TSVs is coupled to the power supply when the second transistor is provided with the test signal at a low level and the first gate circuit provides the TSV selection signal at a low level, and wherein the power supply is configured to charge an associated signal path via the associated TSV.

18. The apparatus of claim 14, wherein the second gate circuit is configured to receive the corresponding TSV row and column selection signals and a fail signal, wherein responsive to the corresponding TSV row and column selection signals and the fail signal being high, the second gate circuit is further configured to activate a fail flag to a high level, and wherein the fail signal is supplied to the second switch circuit and the fail information is written to the corresponding latch circuit.

19. The apparatus of claim 14, wherein the first semiconductor chip further composes a second selection circuit, the second selection circuit comprises:
  a third transistor;
  a third gate circuit configured to supply the TSV selection signal to a second transistor based on the corresponding TSV row and column selection signals and an interface chip selection signal; and
  a fourth gate circuit configured to control a corresponding latch circuit included in the first switch circuit.

20. The apparatus of claim 19, wherein the first semiconductor chip further comprises:
  a node coupled to the second selection circuit; and
  a comparison circuit configured to compute a level of the node with a reference potential and set an output signal to a high level when the level of the node is higher, wherein the output signal at a high level indicates a fail signal supplied to the first switch circuit is maintained in an inactive state.

* * * * *

UNITED STATES PATENT AND TRADEMARK OFFICE
CERTIFICATE OF CORRECTION

PATENT NO. : 11,380,414 B2
APPLICATION NO. : 17/173064
DATED : July 5, 2022
INVENTOR(S) : Naohisa Nishioka It is certified that error appears in the above-identified patent and that said Letters Patent is hereby corrected as shown below:

In the Claims

| | Reads | Should Read |
|---|---|---|
| Column 10, Line 13 | "The method of claim 8, farther comprising" | -- The method of claim 8, further comprising -- |
| Column 10, Line 63 | "The apparatus of claim 14, wherein the fast gate circuit" | -- The apparatus of claim 14, wherein the first gate circuit -- |
| Column 12, Line 2 | "the first semiconductor chip further composes a second" | -- the first semiconductor chip further comprises a second -- |
| Column 12, Line 14 | "to compute a level of the node with a reference potential" | -- to compare a level of the node with a reference potential -- |
| Column 19, Line 42 | "semiconductor chip is stacked on the fast semiconductor chip." | -- semiconductor chip is stacked on the first semiconductor chip. -- |

Signed and Sealed this
Twentieth Day of September, 2022

Katherine Kelly Vidal
*Director of the United States Patent and Trademark Office*